(12) United States Patent
You et al.

(10) Patent No.: US 6,706,613 B2
(45) Date of Patent: Mar. 16, 2004

(54) METHODS FOR MANUFACTURING STACKED GATES INCLUDING OXIDE/NITRIDE/OXIDE (ONO) INTERLAYER DIELECTRICS USING PRE-ANNEALING AND/OR POST-ANNEALING IN NITROGEN

(75) Inventors: Young-Sub You, Gyeonggi-do (KR); Hun-Hyeoung Lim, Gyeonggi-do (KR); Sang-Hoon Lee, Seoul (KR); Woo-Sung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/359,789

(22) Filed: Feb. 6, 2003

(65) Prior Publication Data

US 2004/0029354 A1 Feb. 12, 2004

(30) Foreign Application Priority Data

Aug. 7, 2002 (KR) .................................... 2002-0046612

(51) Int. Cl.[7] .............................................. H01L 21/76
(52) U.S. Cl. ...................................... 438/424; 438/694
(58) Field of Search ................................ 438/296, 424, 438/435, 700, 694, 742, 721–722

(56) References Cited

U.S. PATENT DOCUMENTS

| | | | | |
|---|---|---|---|---|
| 6,133,150 A | * | 10/2000 | Nakajima et al. | ........... 438/694 |
| 6,368,984 B1 | * | 4/2002 | Tomita et al. | ............... 438/773 |
| 6,548,374 B2 | * | 4/2003 | Chung | ......................... 438/424 |

* cited by examiner

*Primary Examiner*—David Nelms
*Assistant Examiner*—David Vu
(74) *Attorney, Agent, or Firm*—Myers Bigel Sibley & Sajovec

(57) ABSTRACT

A semiconductor device including a stacked gate having stacked gate sidewalls and an oxide/nitride/oxide (ONO) interlayer dielectric is manufactured by pre-annealing the stacked gate in a first atmosphere that includes nitrogen. At least a portion of the stacked gate sidewalls of the stacked gate that has been pre-annealed is oxidized. Post-annealing is then performed on the stacked gate including the stacked gate sidewalls that have been oxidized, in a second atmosphere that includes nitrogen.

29 Claims, 6 Drawing Sheets

METHODS FOR MANUFACTURING STACKED GATES INCLUDING OXIDE/NITRIDE/OXIDE (ONO) INTERLAYER DIELECTRICS USING PRE-ANNEALING AND/OR POST-ANNEALING IN NITROGEN

RELATED APPLICATION

This application claims the benefit of Korean Patent Application No. 2002-46612, filed Aug. 7, 2002, the disclosure of which is hereby incorporated herein by reference in its entirety as if set forth fully herein.

FIELD OF THE INVENTION

This invention relates to semiconductor device manufacturing methods, and more particularly to methods of manufacturing semiconductor devices including stacked genes having oxide/nitride/oxide (ONO) interlayer dielectrics.

BACKGROUND OF THE INVENTION

Stacked gate structures including ONO interlayer dielectrics are widely used, for example, in flash memory devices, such as Electrically Erasable and Programmable Read-Only Memory (EEPROM) devices. In particular, a memory cell of an EEPROM device may include a stacked gate structure including a floating gate adjacent a silicon substrate, an ONO interlayer dielectric on the floating gate opposite the silicon substrate and a control gate on the ONO interlayer dielectric opposite the floating gate. In these flash memories, data storage may be accomplished by storing electrons in the floating gate or extracting electrons from the floating gate, while appropriate voltages are applied to the control gate and/or the substrate. The design and operation of flash memory devices such as EEPROMs are well known to those having skill in the art and need not be desired further herein.

Figure 1:
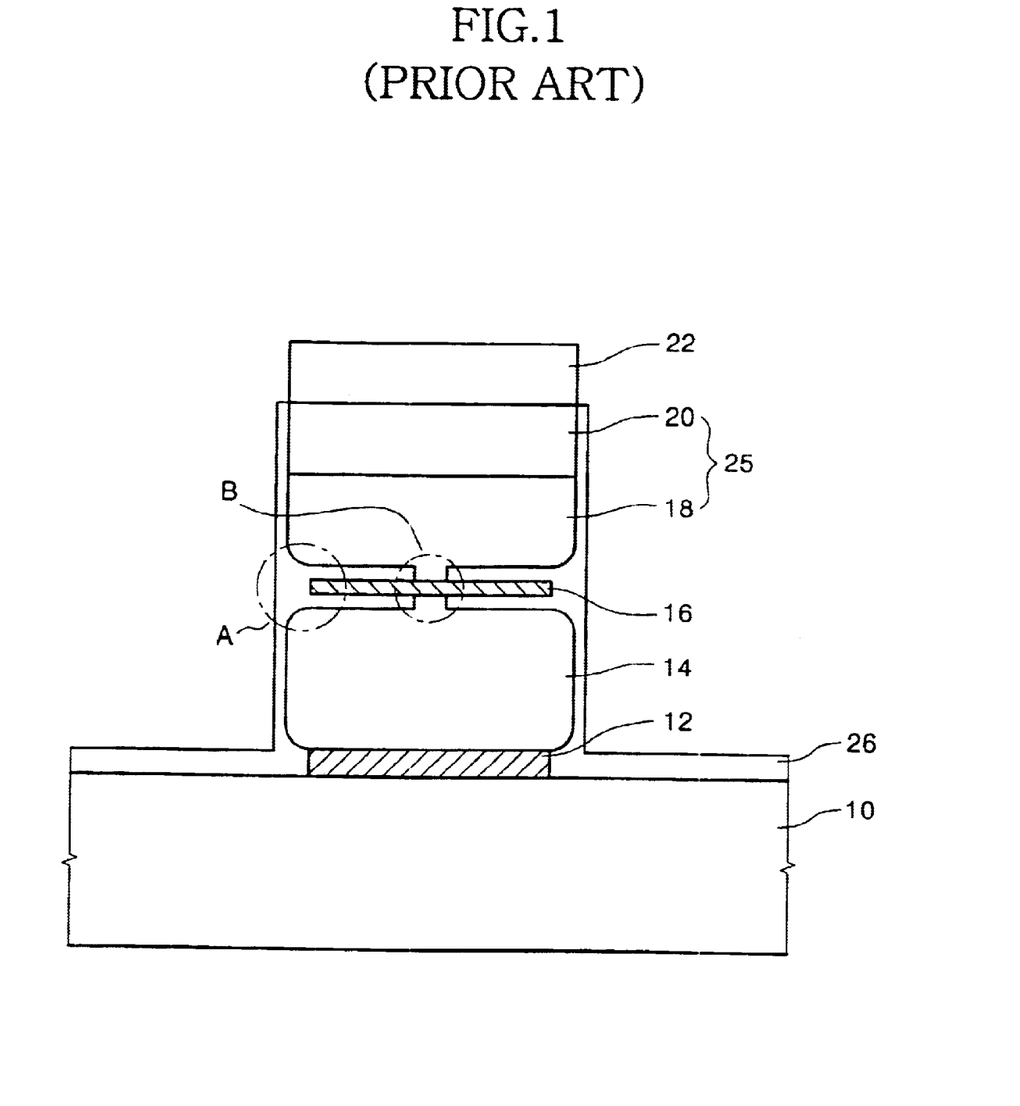
FIG. 1 is a cross-sectional view of a non-volatile semiconductor memory device that is fabricated according to a conventional manufacturing method.

FIG. 1 is a cross-sectional view showing a non-volatile semiconductor memory device that is fabricated according to a conventional manufacturing method.

Referring to FIG. 1, a tunnel oxide film 12 (such as a gate oxide film) is formed in a semiconductor substrate 10, such as a silicon semiconductor substrate, that is divided into an active region and a field region. After a first polysilicon film is coated on the tunnel oxide film, the first polysilicon film is partially removed from the field region through a photolithography process, so that the floating gates formed in adjacent active regions are electrically insulated from each other.

Then, an oxide/nitride/oxide (ONO) layer 16 is formed on the substrate 10 having the resultant structure. The ONO layer 16 serves as an interlayer dielectric, and includes a first oxide film, a nitride film, and a second oxide film.

A second polysilicon film and a metal silicide film are successively formed on the ONO layer 16. After a hard mask layer for patterning the gate is formed on the metal silicide film, the hard mask layer is patterned to form a hard mask pattern 22.

The metal silicide film, the second polysilicon film, the ONO layer 16, and the first polysilicon film are successively etched using the hard mask pattern 22 as an etching mask. Thus, a stacked gate of a memory cell including a floating gate 14 and a control gate 25 with the ONO layer 16 therebetween, is formed on the substrate 10. The floating gate 14 includes a first polysilicon pattern, and the control gate 25 includes a second polysilicon pattern 18 and a metal silicide pattern 20.

After the patterning process for forming the stacked gate is completed, a process for oxidizing the gate sidewalls is executed in order to cure the damage to the lateral (end) portions of the ONO layer 16 and the damage to the substrate 10 under the edge portion of the floating gated 14 that may be caused by the prior etching process. The process for oxidizing the gate is conventionally performed at a temperature of more than approximately 600° C. about 3 hours. As a result, an oxide film 26 is formed on the surface of the substrate 10, on the sidewalls of the floating gate 14, and on the sidewalls of the control gate 25, by an oxidation process. The oxide film 26 also can function as a buffer layer for reducing or preventing the substrate 10 from being damaged during a successive ion implantation process for forming a source/drain region.

In general, the oxide film is formed in accordance with the following reaction equation:

As shown the above reaction equation, oxidizing agents are diffused into a layer including silicon to produce an oxidation reaction between the silicon and the oxidizing agents. Thus, the oxidation reaction occurs at the sidewalls of the floating gate 14, at the interface between the floating gate 14 and the ONO layer 16, at the interface between the control gate 15 and the ONO layer 16, and at the sidewalls of the control gate 25.

However, the oxidizing agents may permeate from the upper portion of the control gate 25 to the central portion B of the ONO layer 16 so that a bird's beak A may occur as shown in FIG. 1, since the oxidation process is performed at a temperature of more than 600° C. for a long time. In the same manner, the oxidizing agents may permeate from the upper portion of the floating gate 14 to the central portion B of the ONO layer 16 so that a bird's beak A further occurs. As the thickness of the ONO layer 16 increases due to the bird's beak, the capacitance between the floating and the control gates 14 and 25, respectively, may be reduced. In addition, the programming speed and/or the cell current may be reduced. Furthermore, because the electric field may be concentrated at the portion where the ONO layer 16 is thin, dielectric breakdown of the ONO layer 16 may occur.

SUMMARY OF THE INVENTION

Some embodiments of the present invention provide methods for manufacturing a semiconductor device including a stacked gate having stacked gate sidewalls and an oxide/nitride/oxide (ONO) interlayer dielectric. According to some embodiments of the invention, pre-annealing is performed on the stacked gate in a first atmosphere comprising nitrogen. At least a portion of the stacked gate sidewalls of the stacked gate that has been pre-annealed is oxidized. Post-annealing is then performed on the stacked gate including the stacked gate sidewalls that have been oxidized, in a second atmosphere comprising nitrogen.

In other embodiments of the invention, a temperature of a batch furnace having therein a semiconductor device that includes a stacked gate having stacked gate sidewalls and an ONO interlayer dielectric, is raised in an inert gas atmosphere. Pre-annealing is performed on the stacked gate in the batch furnace in a first atmosphere that comprises nitrogen. At least a portion of the stacked gate sidewalls of the stacked gate that has been pre-annealed is oxidized. Post-annealing is performed on the stacked gate including the stacked gate sidewalls that have been oxidized, in a second atmosphere comprising nitrogen.

According to still other embodiments of the invention, a temperature of a single wafer rapid oxidation apparatus having therein a semiconductor device that includes a stacked gate having stacked gate sidewalls and an ONO interlayer dielectric, is raised in an inert gas atmosphere. At least a portion of the stacked gate sidewalls of the stacked gate is oxidized in the single wafer rapid oxidation apparatus in which the temperature has been raised. Post-annealing then is performed on the stacked gate including the stacked gate sidewalls that have been oxidized, in an atmosphere comprising nitrogen.

In all of the above embodiments, the first and second atmospheres may comprise at least one of $N_2$, $N_2O$ and NO. Moreover, in all of the above embodiments, the first and second atmospheres may comprise different gasses. Also, in all of the above embodiments, the pre-annealing, oxidizing and post-annealing may be performed at the same temperature. Finally, in all of the above embodiments, the inert gas atmosphere may comprise at least one of $N_2$, $N_2O$, NO, Ar and He.

In some embodiments, the pre-annealing, oxidizing and post-annealing are performed in a single processing chamber. In other embodiments, the pre-annealing and the oxidizing are performed in separate processing chambers. In still other embodiments, the raising, the pre-annealing, the oxidizing and the post-annealing are all performed in a batch furnace. In yet other embodiments, the oxidizing and the post-annealing are performed in a single wafer rapid oxidation apparatus. Finally, in still other embodiments, the post-annealing is performed in a batch furnace.

DETAILED DESCRIPTION OF PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Figure 2A:
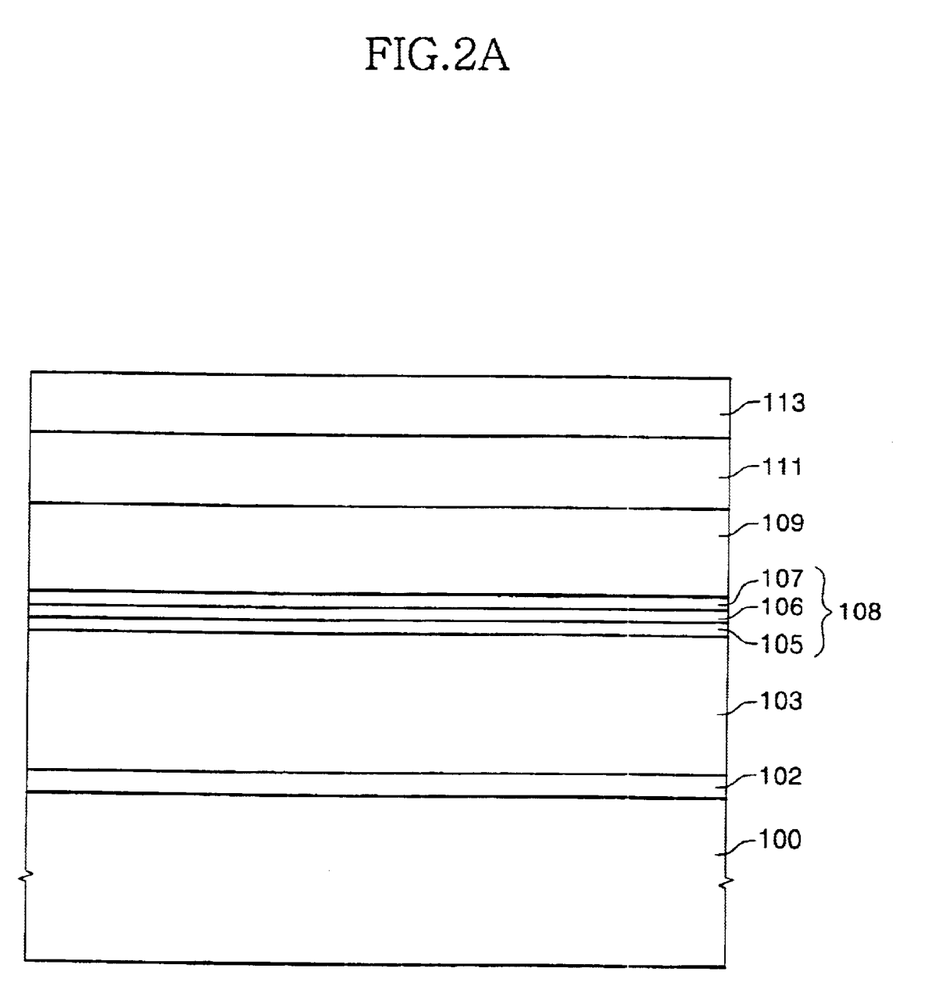
FIGS. 2A to 2C are cross-sectional views illustrating methods of manufacturing semiconductor devices, according to embodiments of the present invention, during intermediate fabrication steps according to embodiments of the present invention.
Figure 2B:
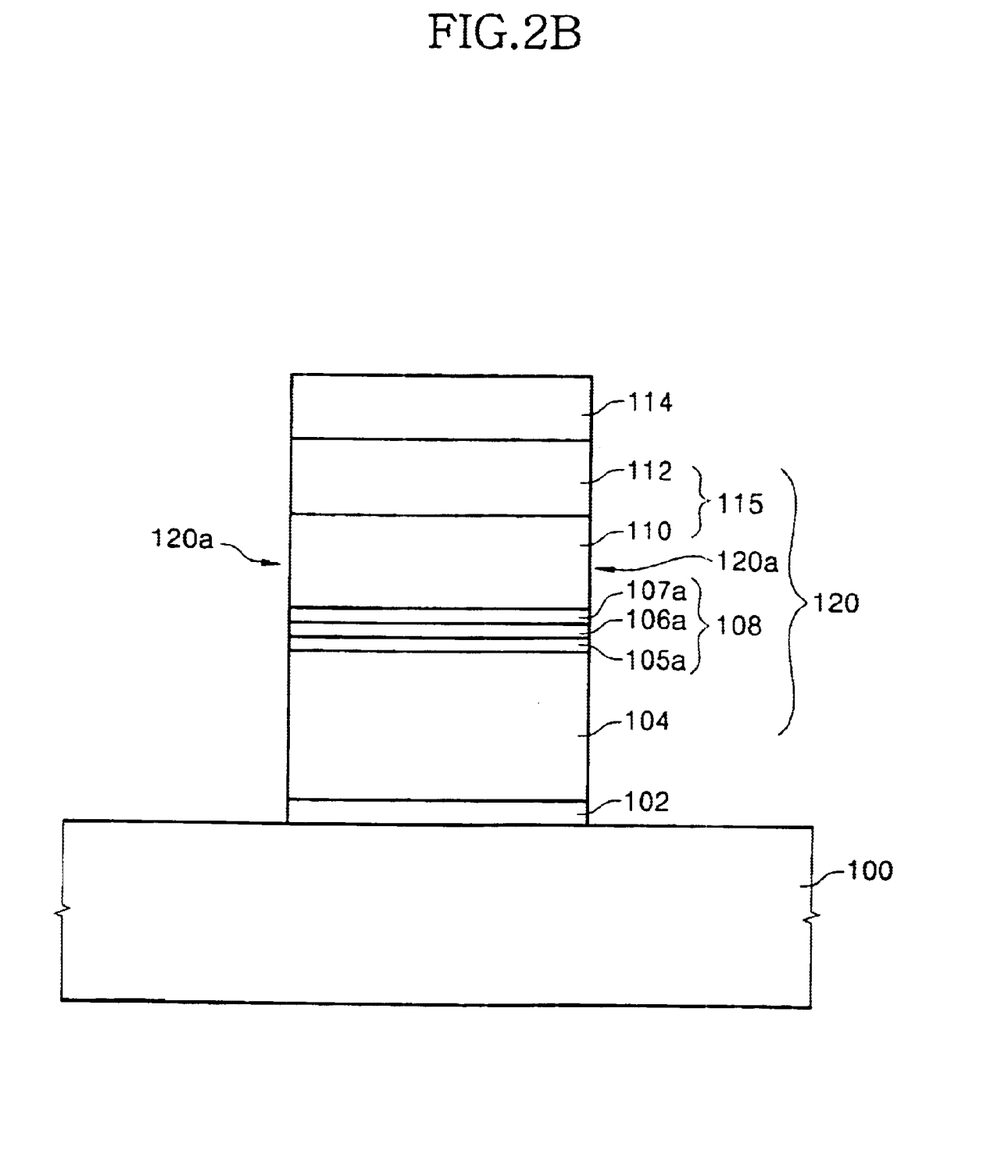
Figure 2C:
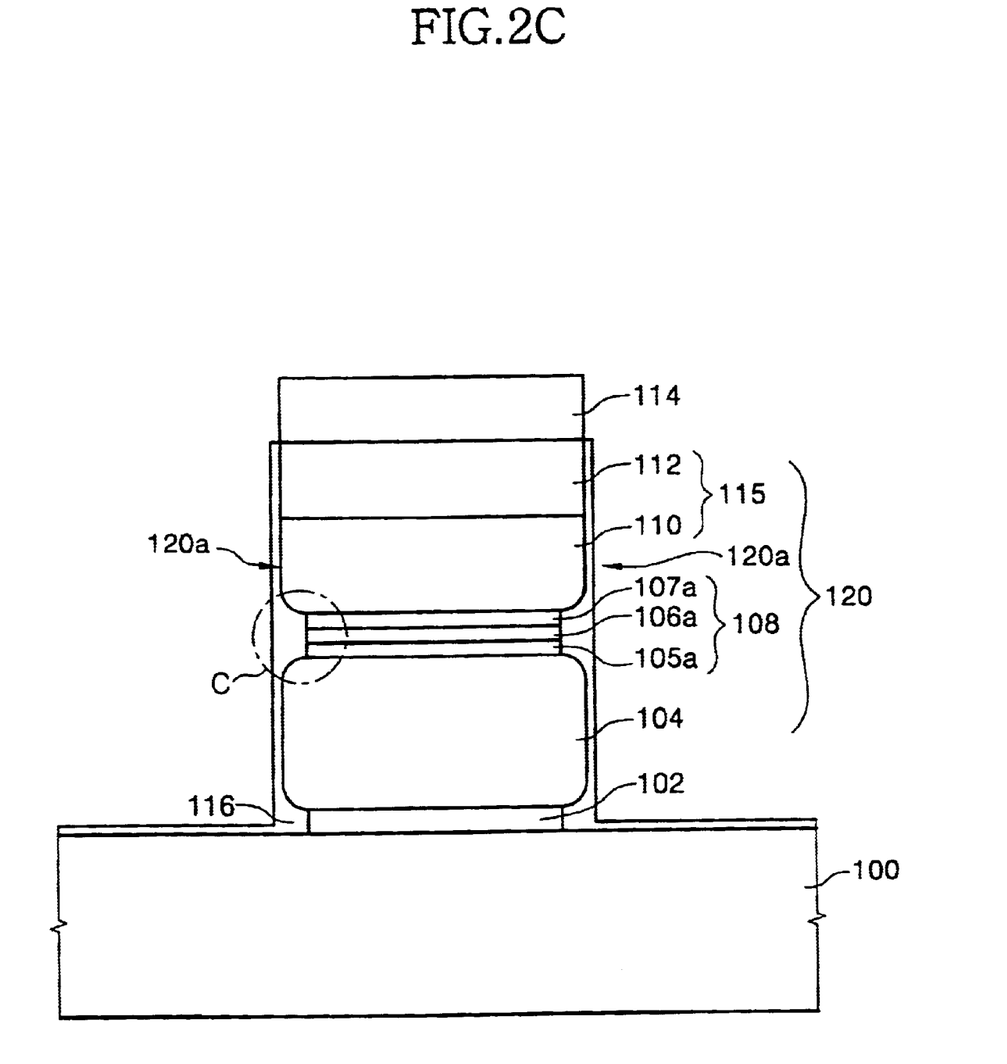

FIGS. 2A to 2C are cross-sectional views illustrating methods of manufacturing semiconductor devices, according to embodiments of the present invention, during intermediate fabrication steps according to embodiments of the present invention.

Referring to FIG. 2A, a semiconductor substrate 100, such as a silicon semiconductor substrate, is divided into an active region and a field region by an isolation process such as a shallow trench isolation (STI) method. In detail, after the semiconductor substrate 100 is etched to a predetermined depth for forming a trench, an oxide film is formed on the semiconductor substrate 100 to cover the trench formed in the semiconductor substrate 100 through a chemical vapor deposition (CVD) process. The CVD oxide film is partially removed by an etch back process and/or a chemical-mechanical polishing (CMP) process such that the CVD oxide film remains only in the trench, thereby forming a field oxide film in the trench. Other conventional isolation technologies may be used.

The field region of the semiconductor substrate 100 can be formed through a local oxidation of silicon (LOCOS) process and/or a self-aligned shallow trench isolation (SA-STI) process in which a floating gate and the active region are simultaneously formed. Other conventional technologies also may be used.

Then, a tunnel oxide film 102 (such as a gate oxide film) having, for example, thickness of about 70 Å to about 100 Å, is formed on the semiconductor substrate 100 by a thermal oxidation process. Other techniques also may be used.

A first conductive film 103 is formed on the tunnel oxide film 102 so that the first conductive film has a thickness of, for example, about 1000 Å to about 1500 Å. In a memory device, the first conductive film 103 serves as a floating gate, and includes polysilicon and/or amorphous silicon. Subsequently, the first conductive film 103 may be highly doped with N-type impurities through a $POCl_3$ diffusion process, an ion implantation process, an in-situ doping process and/or other process. When the first conductive film 103 is partially removed from the field region of the semiconductor substrate 100 through a photolithography process (described below), the floating gate formed in adjacent active regions are electrically insulated from each other.

Still referring to FIG. 2A, in succession, an oxide/nitride/oxide (ONO) layer 108 is formed on the first conductive film 103 on the semiconductor substrate 100. The ONO layer 108 serves as an interlayer dielectric, and includes a first oxide film 105 such as silicon oxide, a nitride film 106 such as silicon nitride, and a second oxide film 107 such as silicon oxide. The ONO layer 108 is formed using a thermal oxidation process, a CVD process and/or other conventional techniques.

A polysilicon film 109 which may be doped N-type and, in some embodiments, a metal silicide film 111, are successively formed on the ONO layer 108. The polysilicon film 109 serves as a second conductive film for a control gate. The metal silicide film 111 can include tungsten silicide ($WSi_x$), titanium silicide ($TiSi_x$), tantalum silicide ($TaSi_x$) and/or other silicides. In some embodiments, the polysilicon film 109 has a thickness of about 1000 Å, and the metal silicide film 111 has a thickness of about 100 Å to about 1500 Å.

Then, a had mask layer 113 for patterning the gate is formed on the metal silicide film 111. The hard mask layer 113 may include single film like an oxide film or a nitride film. Also, the hard mask layer 113 can include a composite film having oxide and nitride. Other hard mask layer compositions may be used.

Referring to FIG. 2B, a hard mask pattern 114 defining a stacked gate region of a semiconductor device is formed by patterning the hard mask layer 113 through a photolithography process. The metal silicide film 111, the polysilicon film 109, the ONO layer 108, and the first conductive film 103 are successively etched using the hard mask pattern 114 as an etching mask during a dry etching process and/or other etching process. Hence, a stacked gate 120 including a floating gate 104, a control gate 115 and an ONO interlayer dielectric 108 therebetween, is formed on the semiconductor substrate 100. The stacked gate 120 includes stacked gate sidewalls 120a. The floating gate 104 includes a first conductive pattern formed by patterning the first conductive film, and the control gate 115 includes a polysilicon pattern 110 and a metal silicide pattern 112 which are formed by patterning the polysilicon film 109 and the metal silicide film 111, respectively.

In FIG. 2B, reference numerals of 105a, 106a and 107a represent a first oxide pattern, a nitride pattern, and a second oxide pattern, respectively. Thus, the ONO layer 108 includes the first oxide pattern 105a, the nitride pattern 106a, and the second oxide pattern 107a.

Referring to FIG. 2C, after the patterning process for forming the stacked gate 120 is completed, a process for oxidizing the gate is executed. As a result, an oxide film having, for example, a thickness of less than approximately 40 Å, is formed on the surface of the substrate 100, and on at least a portion of the stacked gate sidewalls 120, for example on at least a portion of the sidewalls of the floating gate 104, and on at least a portion of the sidewalls of the control gate 115, in accordance with the oxidation process.

Figure 5:
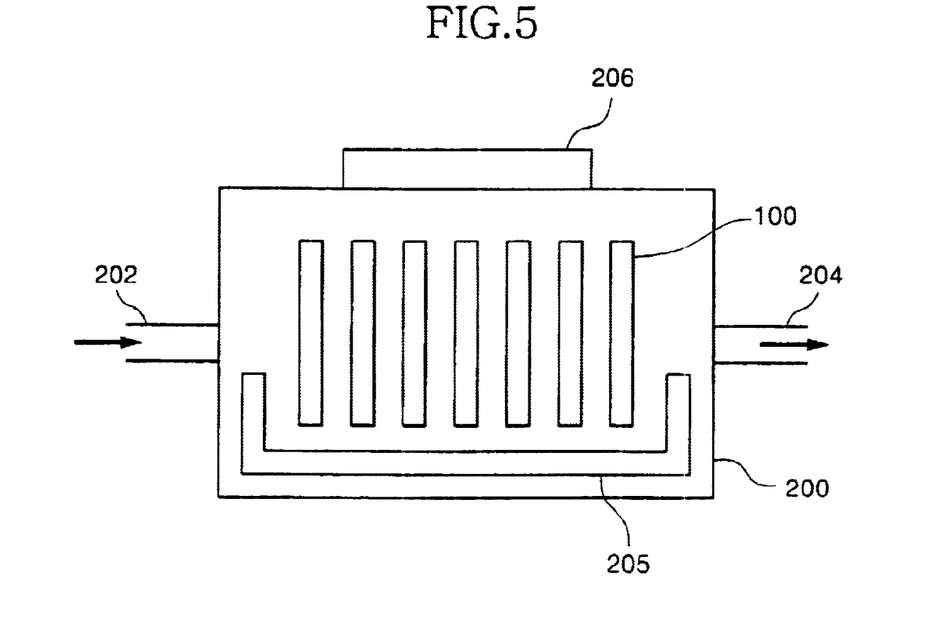
FIG. 5 is a schematic cross-sectional view of a batch furnace that may be used in embodiments of the present invention.
Figure 6:
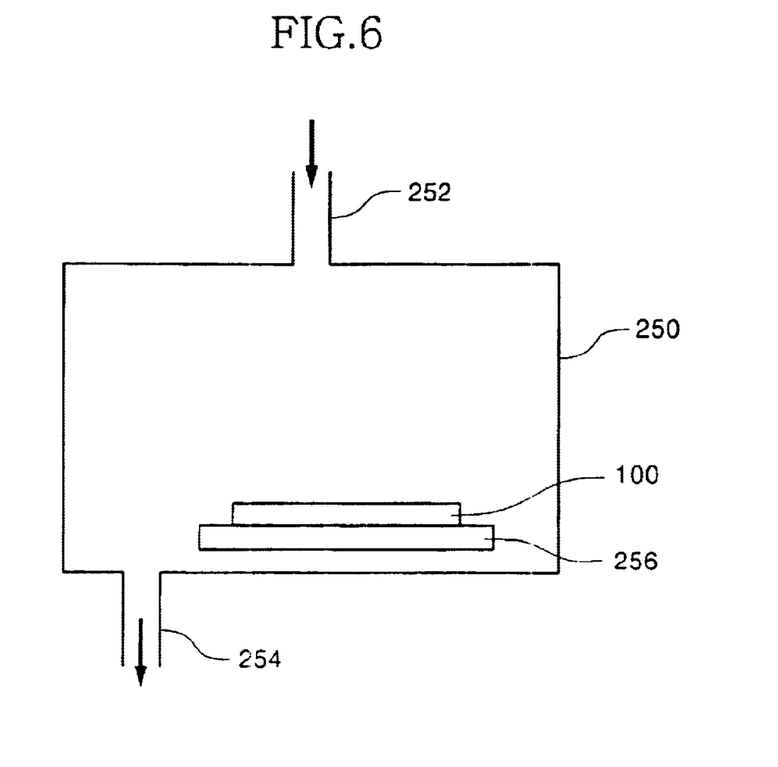
FIG. 6 is a schematic cross-sectional view of a single wafer rapid oxidation apparatus that may be used in other embodiments of the present invention.

FIG. 5 is a schematic cross-sectional view illustrating a batch furnace for oxidizing a gate according to some embodiments of the present invention, and FIG. 6 is a schematic cross-sectional view illustrating a single wafer rapid oxidation apparatus for oxidizing a gate according to other embodiments of the present invention. In embodiments of the present invention, the process for oxidizing the stacked gate can be accomplished using the batch furnace and/or the single wafer rapid oxidation apparatus with various recipes.

The batch furnace of FIG. 5 can simultaneously process a plurality of wafers, and includes a chamber 200, a carrier or a boat 205, a gas inlet 202, a vacuum port 204, and a heater 206. The boat 205 transfers the semiconductor substrates 100 such as a plurality of wafers into the chamber 200 and/or draws out the semiconductor substrates 100 from the chamber 200. A reaction gas or other gas flows into the chamber 200 through the gas inlet 202. The vacuum port 204 maintains the pressure of the chamber 200, and the heater 206 also maintains the chamber 200 at a desired temperature.

The single wafer rapid oxidation apparatus can separately process the wafers, and includes a reaction chamber 250, a substrate table 256, a gas inlet 252, and a vacuum port 254 as shown in FIG. 6. The substrate 256 supports a semiconductor substrate 100 such as a wafer. The functions of the gas inlet 252 and the vacuum port 254 can be identical to those of the batch type furnace.

Hereinafter, methods for oxidizing stacked gates according to embodiments of present invention will be described.

Figure 3:
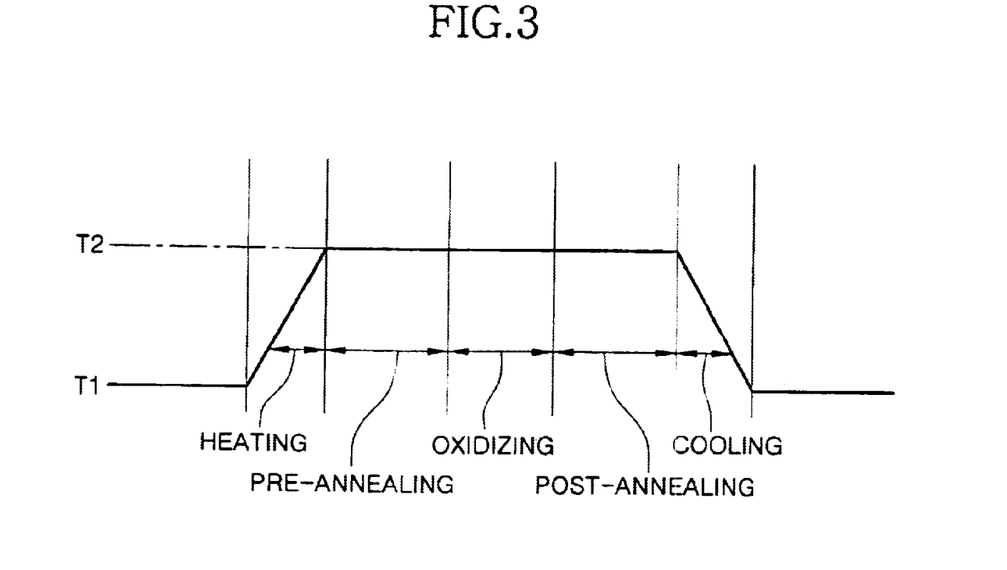
FIG. 3 is a graph illustrating a temperature profile according to some embodiments of the present invention.

FIG. 3 is a graph illustrating a temperature profile according to some embodiments of the present invention, which may be accomplished with a batch furnace shown in FIG. 5, in some embodiments of the present invention. Referring to FIGS. 3 and 5, the substrate 100 including the stacked gate 120 having the ONO layer 108 is loaded into the chamber 200 of the batch furnace.

While the chamber 200 is heated from an initial temperature T1 to a processing temperature T2, inert gases including at least one of $N_2$, $N_2O$, NO, Ar and He are introduced into the chamber 200 through the gas inlet 202 such that the growth of an oxide film is restrained on the substrate 100. Because the substrate 100 is not significantly exposed to oxygen during the steps of loading and heating the substrate 100, a significant bird's beak is not formed at the ends of the ONO layer 108 during a successive oxidation process.

When the temperature of the chamber 200 is raised to the processing temperature T2, for example, a temperature of more than approximately 600° C., a first atmosphere comprising nitrogen (N) flows into the chamber 200 through the gas inlet 202 so that the substrate 100 is pre-annealed. In some embodiments, the first atmosphere comprising nitrogen includes at least one of an $N_2$ gas, an $N_2O$ gas and an NO gas.

Without wishing to be bound by any theory of operation, when the substrate 100 is pre-annealed with the first atmosphere comprising nitrogen, a film containing nitrogen appears to be formed on the surface of the substrate 100 and on the sidewalls 102a of the stacked gate 120. Thus, bonds of Si—N having high bonding strength appear to be generated at the surface of the substrate 100 and on the sidewalls 120a of the stacked gate 120, while the dangling bonds of Si appear to be reduced. These bonds of Si—N do not appear to break during the successive oxidation process so that oxidizing agents do not appear to penetrate into the central portion of the ONO layer 108.

Continuing with the description of FIG. 3, the oxidizing process, for example a dry oxidation process with an $O_2$ gas, is performed in order to cure the damage that may have occurred at the ends of the ONO layer 108, under the processing temperature T2. Thus, as shown in FIG. 2C, an oxide film 116 having a thickness of, for example, no more than about 40 Å, is formed on the surface of the substrate 100, and on the sidewalls of the floating gate 104 and the control gate 115.

Without wishing to be bound by any theory of operation, the oxidizing agents do not appear to permeate into the central portion of the ONO layer 108 due to the film containing nitrogen that was previously formed on the surface of the substrate 100 and on the sidewalls 120a of the stacked gate 120 during the oxidation process. Hence, the generation of the bird's beak can be reduced or minimized at the ends of the ONO layer 108 (see "C" in FIG. 2C). Thus, the process for oxidizing the gate can be reliably performed because the damaged lateral portion of the ONO layer 108 caused by etching the gate can be oxidized, without substantial, if any, oxidation of the central portion of the ONO layer 108.

Subsequently, the substrate 100 is post-annealed using a second atmosphere comprising nitrogen provided through the gas inlet 202 as the processing temperature T2 is maintained. The second atmosphere comprising nitrogen can include one of $N_2$ gas, $N_2O$ gas, and NO gas. In some embodiments, the first and second atmospheres comprising nitrogen are the same and, in other embodiments, they are different.

Without wishing to be bound by any theory of operation, when the substrate 100 is post-annealed with the second atmosphere comprising nitrogen, nitrogen appears to be piled up at the boundaries of the oxide film 116, the substrate 100 and the stacked gate 120 so that a silicon oxy-nitride film ($SiO_xN_y$) appears to be formed. The bonds of Si—N in the silicon oxy-nitride film can reduce trap sites, and can make the oxide film 116 stable under the stress caused by heat and/or electric field.

Finally, the chamber 200 is cooled from the processing temperature T2 to a lower temperature such as the initial temperature T1. The substrate 100 then is unloaded from the chamber 200 using the boat 205.

In some embodiments of the present invention, the steps of pre-annealing the substrate 100, forming the oxide film 116 (oxidizing), and the post-annealing the substrate 100 are performed at the processing temperature T2 corresponding to a main temperature. In some embodiments, those steps are all performed in-situ in a batch furnace or other apparatus.

Figure 4:
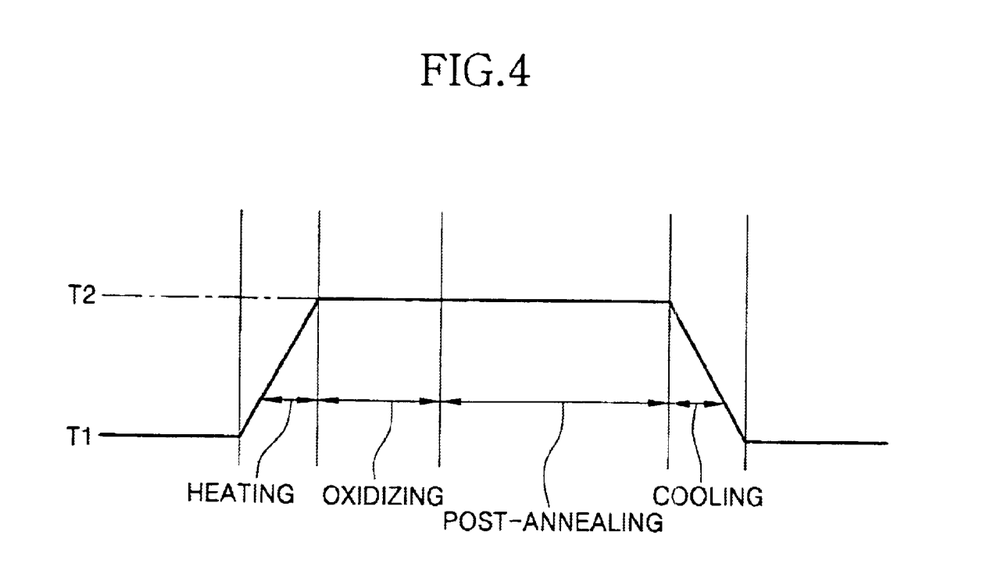
FIG. 4 is a graph illustrating a temperature profile according to other embodiments of the present invention.

FIG. 4 is a graph illustrating a temperature profile according to other embodiments of the present invention, which may be accomplished in a single wafer rapid oxidation apparatus shown in FIG. 6.

Referring to FIGS. 4 and 6, the substrate 100 including the stacked gate 120 having the ONO layer 108 is loaded into the chamber 250 of the single wafer oxidation apparatus. While the chamber 250 is heated from an initial temperature T1 to a processing temperature T2, an inert gas including at least one of $N_2$, $N_2O$, NO, Ar and He are introduced into the chamber 250 via the gas inlet 252 so that the growth of an oxide film is at least partially restrained on the substrate 100. Because the substrate 100 is not significantly exposed to oxygen during the steps of loading and heating the substrate 100, the growth of a significant bird's beak can be restrained at the lateral portion of the ONO layer 108 during a successive oxidation process.

When the temperature of the chamber 250 is raised to the processing temperature T2, for example a temperature of approximately 950° C., the oxidation process, for example a dry oxidation process using an $O_2$ gas, is executed for no more than approximately one minute in some embodiments and, in some embodiments approximately 40 seconds, in order to cure the damage of the lateral portion of the ONO layer 108. Thus, an oxide film 116 having a thickness of, for example, no more than approximately 40 Å is formed on the surface of the substrate 100, and at the sidewalls of the floating gate 104 and the control gate 115.

In general, the time of the process can be shortened with the single wafer rapid oxidation apparatus because the single wafer rapid oxidation apparatus can more than compensate for the reduced throughput of the process compared to that of the batch type furnace by using high temperature. Hence, when using the process for oxidizing the gate for a short time using the single wafer rapid oxidation apparatus, oxidizing agents do not appear to permeate into the end portions of the ONO layer 108, thereby reducing or minimizing the growth of the bird's beak (see "C" in FIG. 2C).

While the chamber 250 is maintained at the processing temperature T2, an atmosphere comprising nitrogen flows into the chamber 250 through the gas inlet 252 so that the substrate 100 is post-annealed. In some embodiments, the atmosphere comprising nitrogen includes at least one of $N_2$ gas, $N_2O$ gas and NO gas. When the substrate 100 is post-annealed with the atmosphere including nitrogen, a silicon oxynitride film appears to be formed at the outer surfaces of the oxide film 116, the substrate 100, and the stacked gate 120, as was already described.

After the chamber 250 is cooled, for example, from the processing temperature T2 to the initial temperature T1, the substrate 100 is unloaded from the chamber 250.

In the above-described embodiments of the present invention, the steps for forming the oxide film 116 and post-annealing the substrate 100 can be performed at the processing temperature T2 corresponding to a main temperature, and also those steps can be performed in-situ in the single wafer rapid oxidation apparatus.

In methods for oxidizing a gate in accordance with other embodiments of the present invention, after the step of pre-annealing the substrate 100 (FIG. 3) is performed using a first atmosphere comprising nitrogen with the batch type furnace as shown in FIG. 5, the step of oxidizing the gate using a second atmosphere comprising nitrogen, and the step of post-annealing the substrate 100 may be executed with the single wafer rapid oxidation apparatus as shown in FIG. 6.

Also, in methods for oxidizing a gate in accordance with still other embodiments of the present invention, after the step of pre-annealing the substrate 100 and the step of oxidizing the gate (FIG. 3) are performed using a first atmosphere comprising nitrogen in the single type wafer oxidation apparatus as shown in FIG. 5, the step of post-annealing the substrate 100 using a second atmosphere comprising nitrogen may be executed with the batch furnace as shown in FIG. 5. Thus, the step of post-annealing the substrate 100 can compensate for the oxide film 116 not being sufficiently transformed into a silicon oxynitride film during the step of pre-annealing the substrate 100 in the single wafer rapid oxidation apparatus.

As was described above, according to some embodiments of the present invention, the increase of thickness of an ONO layer caused by a bird's beak can be reduced or eliminated while an oxide film having adequate thickness is formed on the sidewalls of a control gate and a floating gate. Thus is, the occurrence of the bird's beak can be reduced or minimized at the ends of the ONO layer. Therefore, the cell characteristic distribution of the semiconductor device can be improved and/or the capacitance between the control and the floating gates can be increased by reducing or preventing the thickness increase in the ONO layer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of manufacturing a semiconductor device including a stacked gate having stacked gate sidewalls and an Oxide/Nitride/Oxide (ONO) interlayer dielectric, the method comprising:
   pre-annealing the stacked gate in a first atmosphere comprising nitrogen;
   oxidizing at least a portion of the stacked gate sidewalls of the stacked gate that has been pre-annealed; and
   post-annealing the stacked gate including the stacked gate sidewalls that have been oxidized, in a second atmosphere comprising nitrogen.

2. A method according to claim 1 wherein the first and second atmospheres comprise at least one of $N_2$, $N_2O$ and NO.

3. A method according to claim 1 wherein the first and second atmospheres comprise different gasses.

4. A method according to claim 1 wherein the pre-annealing, oxidizing and post-annealing are performed at same temperature.

5. A method according to claim 1 wherein the pre-annealing is preceded by:
raising the temperature to a pre-annealing temperature in an inert gas atmosphere.

6. A method according to claim 5 wherein the inert gas atmosphere comprises at least one of $N_2$, $N_2O$, NO, Ar and He.

7. A method according to claim 1 wherein the pre-annealing, oxidizing and post-annealing are performed in a single processing chamber.

8. A method according to claim 1 wherein the pre-annealing and the oxidizing are performed in separate processing chambers.

9. A method according to claim 1 wherein the first atmosphere is free of reactive oxygen.

10. A method according to claim 1 wherein the pre-annealing comprises pre-annealing without oxidizing.

11. A method of manufacturing a semiconductor device including a stacked gate having stacked gate sidewalls and an Oxide/Nitride/Oxide (ONO) interlayer dielectric, the method comprising:
raising a temperature of a batch furnace having the semiconductor device therein in an inert gas atmosphere;
pre-annealing the stacked gate in the batch furnace in a first atmosphere comprising nitrogen;
oxidizing at least a portion of the stacked gate sidewalls of the stacked gate that has been pre-annealed; and
post-annealing the stacked gate including the stacked gate sidewalls that have been oxidized, in a second atmosphere comprising nitrogen.

12. A method according to claim 11 wherein the first and second atmospheres comprises at least one of $N_2$, $N_2O$ and NO.

13. A method according to claim 11 wherein the first and second atmospheres comprise different gasses.

14. A method according to claim 11 wherein the pre-annealing, oxidizing and post-annealing are performed at same temperature.

15. A method according to claim 11 wherein the raising, the pre-annealing, the oxidizing and the post-annealing are all performed in the batch furnace.

16. A method according to claim 11 wherein the oxidizing and the post-annealing are performed in a single wafer rapid oxidation apparatus.

17. A method according to claim 11 wherein the inert gas atmosphere comprises at least one of $N_2$, $N_2O$, NO, Ar and He.

18. A method according to claim 11 wherein the first atmosphere is free of reactive oxygen.

19. A method according to claim 11 wherein the pre-annealing comprises pre-annealing without oxidizing.

20. A method of manufacturing a semiconductor device including a stacked gate having stacked gate sidewalls and an Oxide/Nitride/Oxide (ONO) interlayer dielectric, the method comprising:
raising a temperature of a single wafer rapid oxidation apparatus having the semiconductor device therein in an inert gas atmosphere;
oxidizing at least a portion of the stacked gate sidewalls in the single wafer rapid oxidation apparatus in which the temperature has been raised; and
post-annealing the stacked gate including the stacked gate sidewalls that have been oxidized, in an atmosphere comprising nitrogen.

21. A method according to claim 20 wherein the inert gas atmosphere comprises at least one of $N_2$, $N_2O$, NO, Ar and He.

22. A method according to claim 20 wherein the atmosphere comprising nitrogen comprising at least one of $N_2$, $N_2O$ and NO.

23. A method according to claim 20 wherein the oxidizing and post-annealing are performed at same temperature.

24. A method according to claim 20 wherein the atmosphere comprising nitrogen is a first atmosphere comprising nitrogen and wherein the following is performed between the raising and the oxidizing:
pre-annealing the stacked gate in the single wafer rapid oxidation apparatus in a second atmosphere comprising nitrogen.

25. A method according to claim 24 wherein the second atmosphere comprising nitrogen comprises at least one of $N_2$, $N_2O$ and NO.

26. A method according to claim 24 wherein the pre-annealing and the post-annealing are both performed in the single wafer rapid oxidation apparatus.

27. A method according to claim 24 wherein the pre-annealing comprises pre-annealing without oxidizing.

28. A method according to claim 20 wherein the post-annealing is performed in a batch furnace.

29. A method according to claim 20 wherein the inert gas atmosphere is free of reactive oxygen.

* * * * *